(12) United States Patent
Pyo et al.

(10) Patent No.: US 6,766,502 B1
(45) Date of Patent: Jul. 20, 2004

(54) METHOD AND APPARATUS FOR ROUTING USING DEFERRED MERGING

(75) Inventors: Iksoo Pyo, Hillsboro, OR (US); Michelle Yu, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/476,416

(22) Filed: Dec. 30, 1999

(51) Int. Cl.$^7$ .................................................. G06F 17/50
(52) U.S. Cl. ........................... 716/12; 716/11; 716/13; 716/14
(58) Field of Search .................... 716/10–14, 1, 716/9, 15, 2, 16–18

(56) References Cited

U.S. PATENT DOCUMENTS

| | | | | |
|---|---|---|---|---|
| 5,309,370 A | * | 5/1994 | Wong | 716/13 |
| 5,339,253 A | * | 8/1994 | Carrig et al. | 716/6 |
| 5,506,788 A | * | 4/1996 | Cheng et al. | 716/10 |
| 5,661,663 A | * | 8/1997 | Scepanovic et al. | 716/8 |
| 5,729,466 A | * | 3/1998 | Bamji | 716/10 |
| 5,822,214 A | * | 10/1998 | Rostoker et al. | 716/10 |
| 5,880,970 A | * | 3/1999 | Scepanovic et al. | 716/13 |
| 5,987,086 A | * | 11/1999 | Raman et al. | 716/1 |
| 6,006,024 A | * | 12/1999 | Guruswamy et al. | 716/12 |
| 6,018,622 A | * | 1/2000 | Lin et al. | 716/12 |
| 6,031,981 A | * | 2/2000 | Lee et al. | 716/10 |
| 6,122,443 A | * | 9/2000 | Nishikawa | 716/8 |
| 6,260,177 B1 | * | 7/2001 | Lee et al. | 716/2 |
| 6,401,234 B1 | * | 6/2002 | Alpert et al. | 716/13 |

* cited by examiner

*Primary Examiner*—A. M. Thompson
*Assistant Examiner*—Paul Dinh
(74) *Attorney, Agent, or Firm*—Cynthia T. Faatz

(57) ABSTRACT

A deferred merging router. Partial feasible routing solutions corresponding to each of a subset of a set of wires to be routed are identified. The partial feasible routing solutions are then merged to identify one or more feasible routing solutions for the set of wires to be routed. In one aspect of the invention, the final routing for an integrated circuit device may then be selected from the feasible routing solutions which may be ordered by one or more user-selected cost functions.

30 Claims, 8 Drawing Sheets

METHOD AND APPARATUS FOR ROUTING USING DEFERRED MERGING

BACKGROUND

1. Field

An embodiment of the present invention relates to the field of computer-aided design and, more particularly, to routing for integrated circuit designs.

2. Discussion of Related Art

A sequential routing approach is commonly used to determine wire routing for an integrated circuit design. Referring to FIG. 1, for example, a sequential approach may be used to route wires between X and X', Y and Y' and Z and Z'. For purposes of example, it is assumed that there are only three tracks available for routing in the vertical direction and only four tracks in the horizontal direction as indicated by the dotted lines.

A first wire may be routed between X and X' as shown. The wire between X and X' then becomes an obstacle for all subsequently routed wires. When the route is to be determined for Y and Y', however, there is no available routing solution within the grid shown. To route Y and Y' and then Z and Z', the wire between X and X' is ripped up and rerouted.

If the wire between X and X' is rerouted as shown in FIG. 2, Y and Y' may be routed as shown, but there is then no available routing solution for Z and Z'. Both of the wires shown in FIG. 2 are then ripped up and rerouted. Ripping up and rerouting wires can be time and resource intensive and may still not select a globally optimal routing for the wires to be routed. Further, even where rip-up-re-routing is not necessary or where it is used and successful in routing all of the desired wires, because of the sequential nature of the routing, the routing selected for the first wire may cause less desirable routings to be selected for subsequent wires.

Referring to FIG. 3, sequential routing may also be used to route multi-terminal nets. For one approach, a minimal spanning tree (indicated by the dotted line) may be used to identify the shortest distance between each of the terminals A, B, C and D in the net of FIG. 3. The wire between A and B may be routed first, followed by the wire between B and C and the wire between C and D. The routing for each of these wires is selected sequentially, with little if any information about subsequent wires to be routed. Thus, this type of routing approach may also not provide a globally optimized solution.

Objective-driven routing is another routing approach in which objectives (also referred to as cost functions) such as density, timing, congestion, jog and/or cross-talk, for example, may be specified. Objective-driven routers, to the extent possible, determine wire routes according to the specified objective(s). Currently available objective-driven routers, however, may not do an acceptable job of mixing together multiple objectives that may indicate conflicting results.

Controllability may also be an issue for some objective-driven routers. Conventional objective-driven routers typically do not provide for designers to select objectives on the fly. Thus, if a routing pass begins with a first specified objective, it may not be straightforward to change objectives without having to perform the entire routing pass again.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A method and apparatus for routing using deferred merging is described. For one embodiment, where a set of wires is to be routed, partial feasible routing solutions corresponding to each of a subset of the wires to be routed are identified. The partial feasible routing solutions are then merged to identify one or more feasible routing solutions for the set of wires. For one embodiment, the (partial) feasible routing solutions are ordered by one or more user-selected cost functions so that a relatively more desirable routing solution may be more easily selected as described in more detail below.

Figure 1:
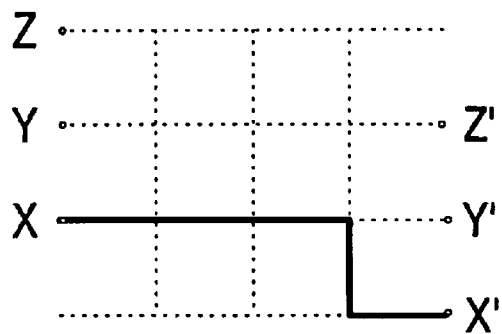
FIG. 1 is a diagram showing a routing solution for a wire between pins X and X' that may be selected by a conventional sequential router.
Figure 2:
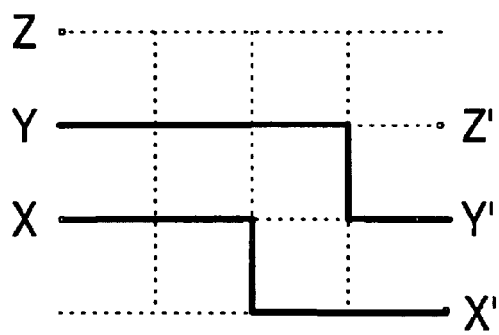
FIG. 2 is a diagram showing routing solutions for a first wire between pins X and X' and second wire between pins Y and Y' that may be selected by a conventional sequential router.
Figure 4:
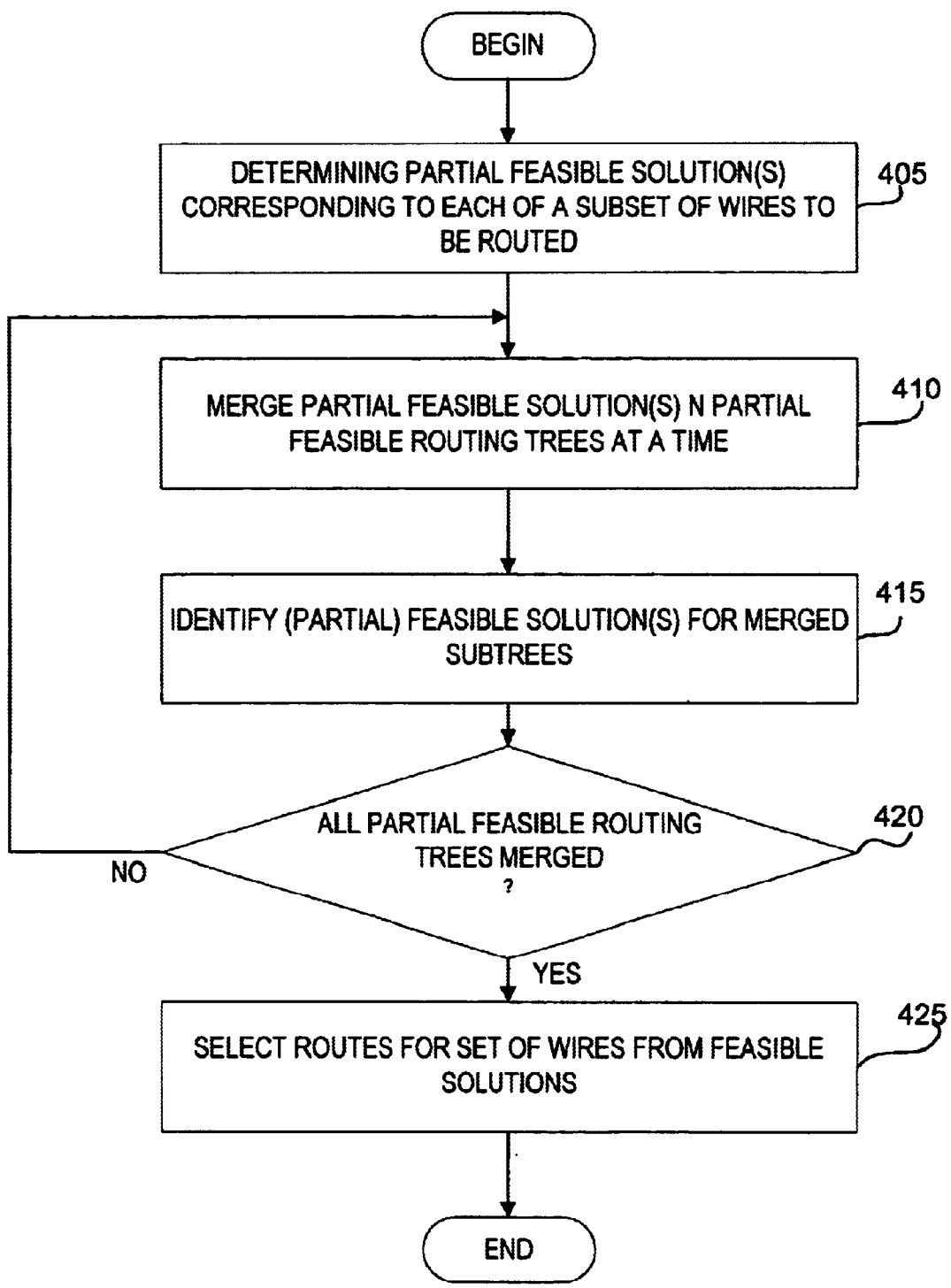
FIG. 4 is a flow diagram showing a method of one embodiment for routing using a deferred merging technique.
Figure 5:
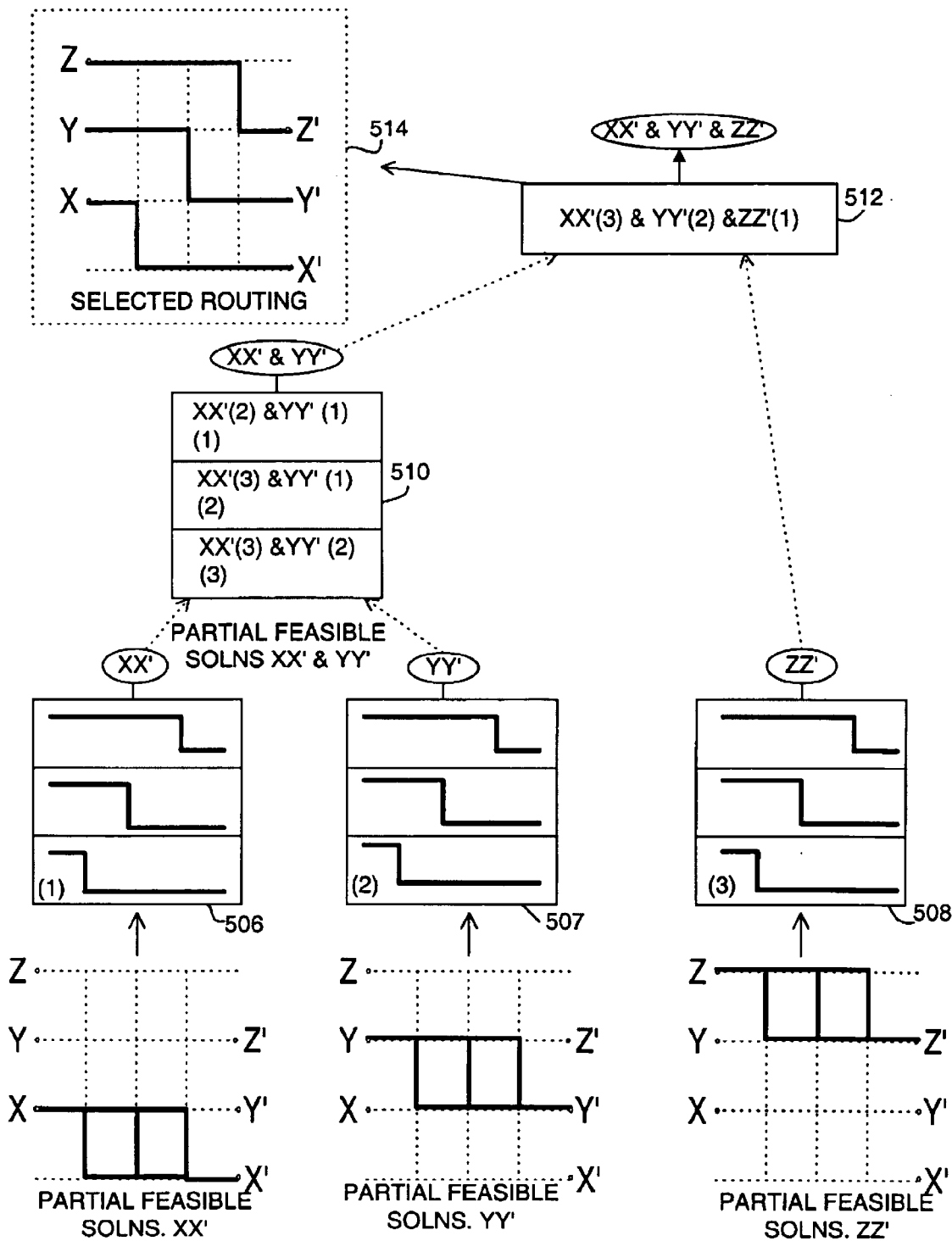
FIG. 5 is a diagram showing a routing tree that may be developed for the routing example of FIGS. 1 and 2 using the routing method of FIG. 4.

FIG. 4 is a flow diagram showing a method of one embodiment for routing wires for an integrated circuit device using a deferred merging technique. The method of FIG. 4 is described with reference to a routing example shown in FIG. 5. In the example of FIG. 5, like the example of FIGS. 1 and 2, wires are to be routed between X and X', Y and Y' and Z and Z'. For purposes of simplicity, the notation XX' is used to refer to the wire to be routed between X and X'. Similarly, YY' refers to the wire to be routed between Y and Y', etc.

At block 405, partial feasible routing solutions are determined for each of a subset of wires to be routed where the subset may include some or all of the wires to be routed. A partial feasible routing solution, as the term is used herein, refers to an intermediate routing solution for fewer than all of the wires to be routed while a feasible routing solution is a routing solution for all of the wires to be routed. A routing solution is feasible if it defines a route between the desired terminals or pins while avoiding obstacles and otherwise meeting specified design rules.

For the example of FIG. 5, partial feasible routing solutions corresponding to each of XX', YY' and ZZ' as shown by plan view diagrams 501, 502 and 503, respectively. As in the example of FIGS. 1 and 2, only three vertical and four horizontal tracks are available for routing XX', YY' and ZZ'. For this example, all feasible routes are identified for each of the corresponding wires when identifying the partial feasible routing solutions.

For other embodiments, however, the number of (partial) feasible routing solutions at any given level in a routing tree may be limited according to designer-specified constraints. Further, for some embodiments, as (partial) feasible routing solutions are identified, they may be ordered according to one or more cost functions. Additional details of these embodiments and the manner in which partial feasible routing solutions may be identified are described below with reference to FIGS. 6–8.

For each of XX', YY' and ZZ', there are three different feasible routes as shown in the corresponding plan view diagrams 501–503 and clarified in the corresponding diagrams 506–508. A group of feasible routes corresponding to a particular wire or group of wires may be referred to herein as a partial feasible routing tree. Thus, each of the blocks 506, 507 and 508 may be considered to represent a partial feasible routing tree for the corresponding wire.

For one embodiment, each partial feasible routing solution identified at block 405 is stored in a memory using X, Y coordinates to indicate, along a centerline of the respective wire, a relative location of source and sink pins and any intermediate jogs.(i.e. changes in direction) in the wire. Additionally, the width of the wire and the corresponding layer(s) of the integrated circuit in which the wire is located may be indicated. For solution (1) in the block 506 corresponding to XX', for example, the coordinates [(X1, Y1), (X2, Y1), (Y2, Y2), (X3, Y2)] may be stored along with the width of the wire and the layer in which the wire is to be routed. While the example of FIG. 5 is a one layer routing example, some wires may traverse multiple layers. Other partial feasible routing solutions may be stored in a similar manner.

Referring back to FIG. 4, at block 410, partial feasible routing solutions identified at block 405 and organized into partial feasible muting trees are then merged, N partial feasible routing trees at a time (where N may be any integer). Any group of N partial feasible routing trees is only merged at this point if there is at least one feasible merged solution. At block 415, merged (partial) feasible solution(s) for the merged partial feasible routing trees are identified.

In identifying the merged (partial) feasible routing solutions, any merged solution that includes conflicting routes is not included. Conflicting routes, as the term is used herein, refers to routes that overlap, plow through, or are closer than specified design rule spacings to another mute. The approach of one embodiment for identifying conflicting routes is described in more detail below.

For one embodiment, N is equal to 2. For the example of FIG. 5, where N is 2, the partial feasible routing tree corresponding to XX' may be merged with the partial feasible routing tree corresponding to YY' at block 410. At block 415, there are only three partial feasible solutions for the merged combination of XX' and YY' that do not create conflicting routes as shown in the table 510. For example, the first partial feasible solution for XX' (i.e. XX' (1) in the block 506) cannot be merged with any partial feasible routing solution for YY' without creating conflicting routes. Thus, there are no merged partial feasible routing solutions for XX' and YY' that include XX' (1). Once identified, the merged (partial) feasible routing solutions may be stored in a memory in a similar manner to the partial feasible solutions described above for XX'.

Referring back to FIG. 4, at decision block 420, it is determined whether all partial feasible routing trees have been merged. For one embodiment, it is determined that all partial feasible routing trees have been merged if all pins/ports have been merged into a single node (tree). If not, the method continues at block 410 where merged partial feasible routing trees are again merged N at a time.

For the example of FIG. 5, at decision block 420, it is determined that the partial feasible routing tree for ZZ' has not been merged. Thus, at block 410, the partial feasible routing tree for ZZ', represented by the block 508, is merged with the partial feasible routing tree for XX' and YY' represented by the table 510. As described above, this merging is only undertaken if at least one merged (partial) feasible solution exists. For the example of FIG. 5, where the partial routing tree for ZZ' is merged with the partial routing tree for XX' and YY', only one merged feasible solution exists as shown in the block 512.

At decision block 420, it is then determined that all partial feasible routing trees have been merged. For one embodiment, when all partial feasible routing trees have been merged, the resulting data structure is referred to as a routing tree and the root of the routing tree is one or more feasible routing solutions.

At block 425, routes for the set of wires to be routed are selected from the feasible routing solutions that have been identified by merging all partial routing trees together in one or more merging passes. For the example of FIG. 5, only one feasible routing solution exists, and thus, the wires are selected to be routed in this manner as shown in the plan view diagram 514.

Where multiple feasible routing solutions are identified, the cheapest route, according to one or more designer-specified cost functions, may be selected. Because the wires are not routed until partial feasible solutions are identified and merged, the above-described routing approach is referred to herein as deferred merging or deferred routing.

Using the above approach, it may be possible to identify one or more feasible routing solutions for a set of wires to be routed without having to rip up and reroute previously routed wires when a conflict with a new wire to be routed is identified. In this manner, the above-described approach may help to speed up the routing process. Further, it may be possible using this technique to identify more globally optimized routing solutions because wire routes are not determined in a sequential manner.

As described in more detail below, controllability and prioritization features of various embodiments can provide additional benefits.

Figure 3:
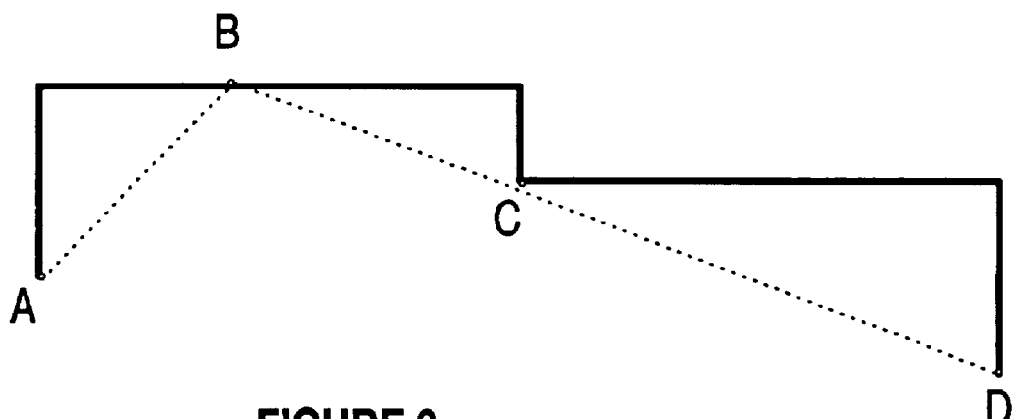
FIG. 3 shows a routing solution that may be selected by a conventional sequential router for a multi-terminal net.
Figure 6:
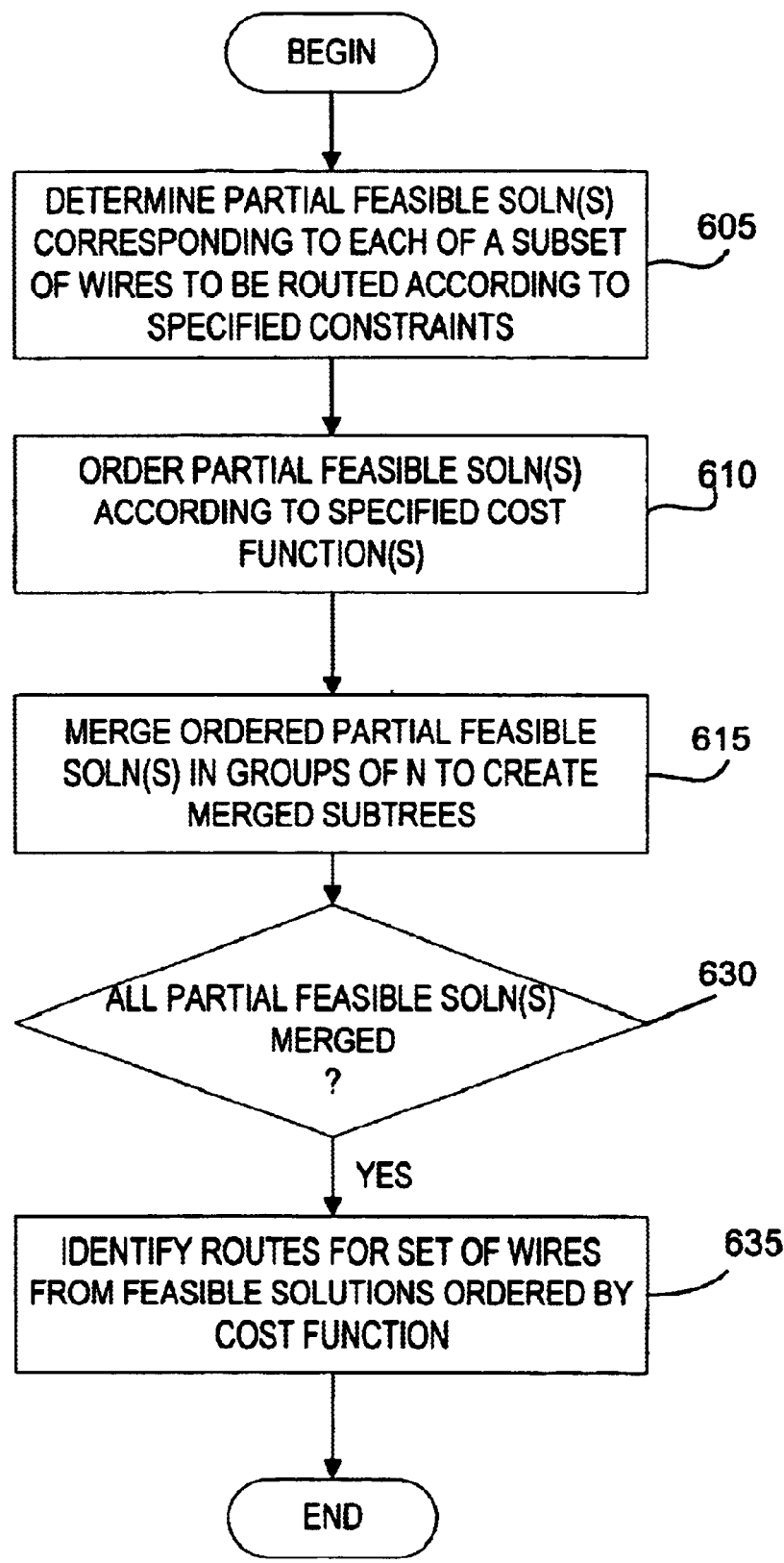
FIG. 6 is a flow diagram showing a method of another embodiment for routing using a deferred merging technique.
Figure 7:
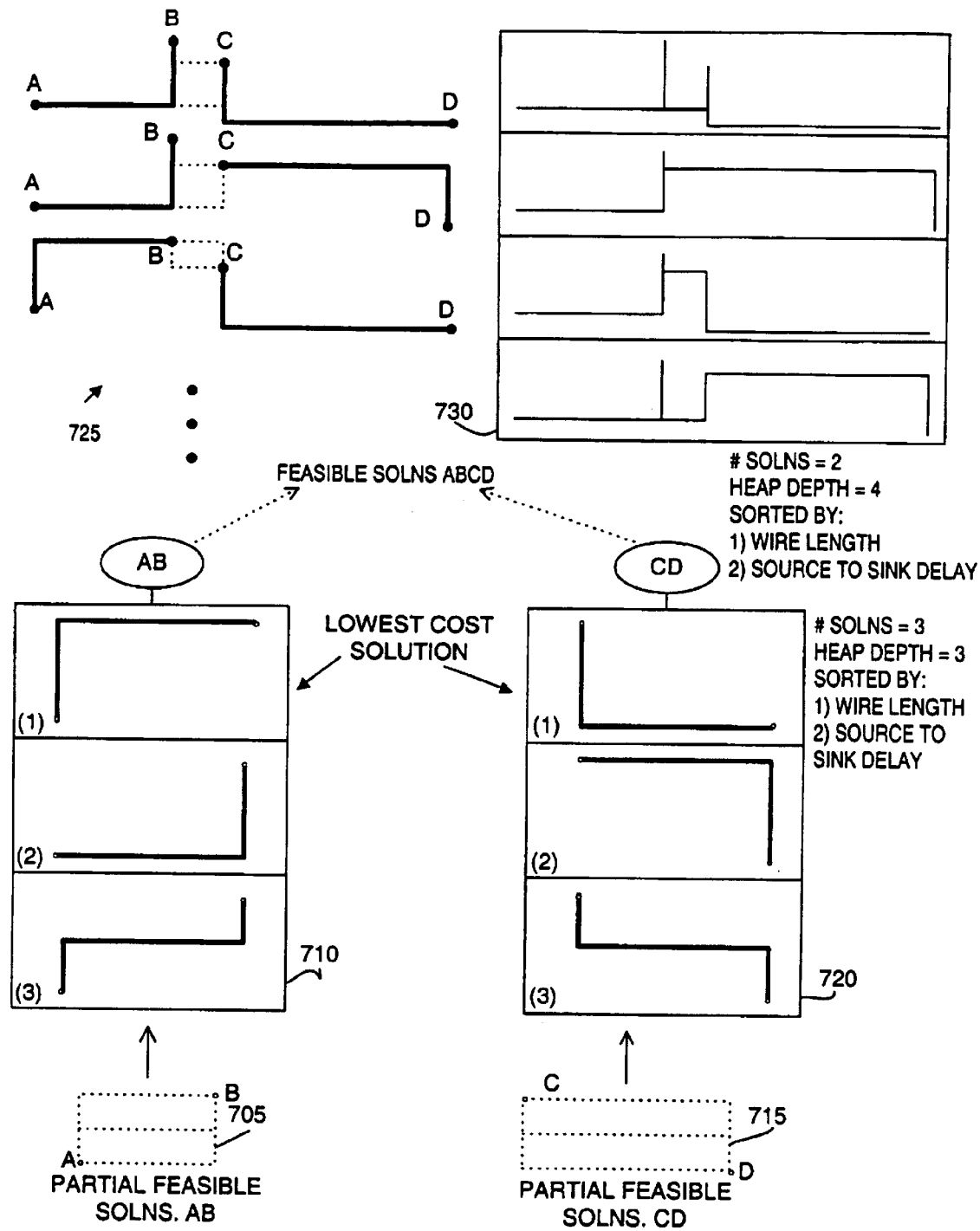
FIG. 7 shows a routing tree that may be developed for the routing example of FIG. 3 using the deferred merging technique of FIG. 6.

Referring to FIG. 6, a method of another embodiment for routing using deferred merging is described. FIG. 7 shows a particular routing example similar to the routing example of FIG. 3 and is referenced in the description of FIG. 6 for purposes of illustration.

For one embodiment, the below-described method may be performed using software that receives as input data, an integrated circuit device floorplan, a netlist indicating ports/pins between which wires are to be routed, obstacles (also referred to as keep-out regions or KORs), and user-specified constraints and/or parameters as described below. Output data from the process is a final routing and, for some embodiments, cost information that may be in the form of a cost graph, for example.

At block 605 partial feasible routing solutions are determined for each of a subset of wires to be routed. Where many wires are to be routed, the particular wires for which the lowest level partial feasible routing solutions are determined may be selected in a number of different ways. For one embodiment, Prim's algorithm may be used to identify sets of pins that are closest to each other and correspond to a same net (i.e. a wire is to be routed between them). Prim's algorithm is an algorithm that may be used to develop a minimum spanning tree and is described in more detail in Prim, "Shortest Connecting Networks," Bell System Technical Journal, vol. 31, 1957, pp. 1398–1409. For other embodiments, other algorithms (e.g. Kruskal's algorithm, J. B. Kruskal, "On the Shortest Spanning Subtree of a Graph and the Traveling Salesman Problem," Proceedings of the American Mathematical Society, Vol. 7, pp. 48–50, 1956) and/or other approaches, such as identification of critical routes to be routed first, may be used to select the first wires for which partial feasible solutions are to be determined.

Figure 8:
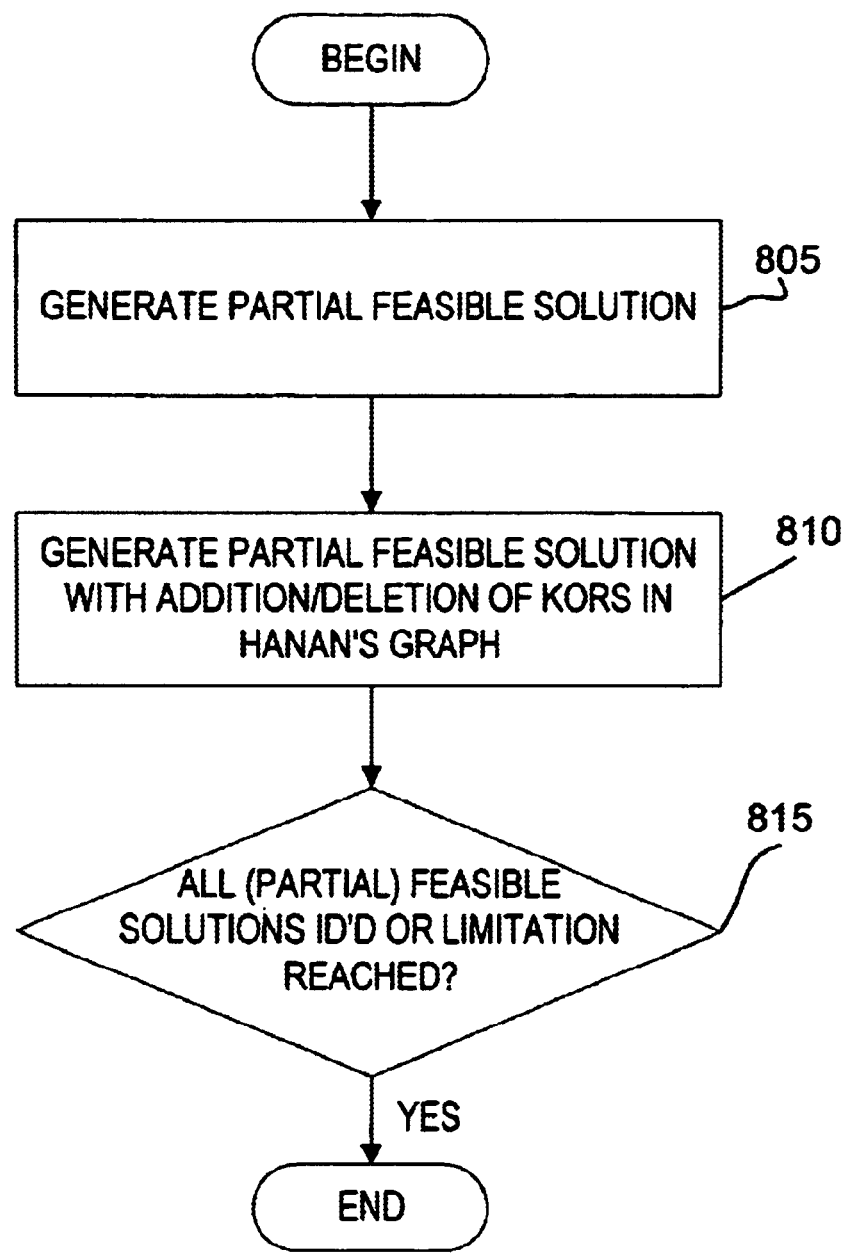
FIG. 8 is a flow diagram showing a method of one embodiment for identifying (partial) feasible solutions.

Partial feasible routing solutions between the selected pins may be determined using a conventional maze router for one embodiment. Referring to FIG. 8, at block 805, Hanan's graph (e.g. doffed line graph in FIG. 1) is generated and a first partial feasible solution is generated using the maze router. Hanan's graph is a well-known approach for defining a solution space for routing solutions. Hanan's graph is described, for example, in M. Hanan, "On Steiner's Problem with Rectilinear Distance, " SIAM Journal of Applied Mathematics, pp. 255–265, March 1966.

This process is repeated at block 810 with the addition and/or deletion of obstacles, also referred to as keep-out-regions or KORs in Hanan's graph. Referring to FIG. 5, for example, a KOR may be inserted for the first solution in 506 at $X_2Y_2$ or $X_2Y_1$. By inserting a KOR in a previous solution, the next solution generated will be unique. At decision block 815, it is determined whether all partial feasible solutions have been identified and/or whether a user-specified partial feasible solution limitation (see below) has been reached. If not, the method continues at block 810 until all partial feasible solutions have been identified or a user-specified limitation has been reached. Using this approach, it is possible to identify all feasible routes between the two selected pins. It will be appreciated that other types of routers such as a pattern router, for example, may also be used to identify feasible solutions.

As mentioned above, for some embodiments, the number of partial feasible solutions at a given node in the routing tree may be limited if desired. A designer may specify a heap depth constraint, for example, to limit the number of (partial) feasible solutions saved in a heap corresponding to the node. Other approaches for limiting the number of solutions at a given node are within the scope of various embodiments.

By enabling a designer to specify heap depth for some or all of the nodes in the routing tree, the designer has flexibility and control over memory consumption. In this manner, if the problem is relatively small, for example, the designer may not place limits on the number of partial feasible solutions identified at any given node. Since all partial feasible solutions are then identified and stored, there is a higher confidence that a substantially optimal routing solution will be identified. If instead, however, the problem size is relatively large and/or it is desirable to identify a final routing solution in a given period of time, the designer can place limits on memory consumption while still providing a high quality routing solution.

With continuing reference to FIG. 6, at block 610, as partial feasible routing solutions are identified at block 605, they are sorted by one or more cost functions that may also be specified by a designer. By ordering identified partial routing solutions according to the one or more user-specified cost functions, where heap depth is limited, the partial routing solutions that are more desirable from the standpoint of the specified cost functions are saved in the heap.

Examples of cost functions that may be specified include wire length, source to sink delay, crosstalk, jog, congestion and power. Other types of cost functions may also be specified for various embodiments. To determine the cost associated with a particular partial feasible solution, one or more estimation engines corresponding to the selected cost function(s) may be used. The cost(s) associated with each partial feasible solution is then stored along with the X and Y coordinates, wire width and layer information.

Referring now to the example of FIG. 7, partial feasible routing solutions are first determined for a wire to be routed between pin A and pin B (AB) and for a wire to be routed between pin C and pin D (CD) in a multi-terminal net. The partial feasible routes for AB are shown in dotted lines in the diagram 705 and are stored as shown in the table 710 while the partial feasible routes for CD are shown in diagram 715 and are stored as shown in the table 720.

For this example, the heap depth has been limited to three for each of the node corresponding to AB and the node corresponding to CD, but, in this case, there are only three feasible solutions for each wire. Also in this example, wire length and worst case source to sink delay have been specified as cost functions against which the identified partial feasible solutions are ordered. The lowest cost solution in terms of these specified cost functions is the first entry (1) in the tables 710 and 720.

Referring back to FIG. 6, at block 615, the groups of ordered partial feasible solution(s) identified at blocks 605 and 610 are merged in groups of N to create merged subtrees. Prim's algorithm may be used again for one embodiment to determine the order in which nodes are merged. Other approaches may be used for other embodiments.

Figure 9:
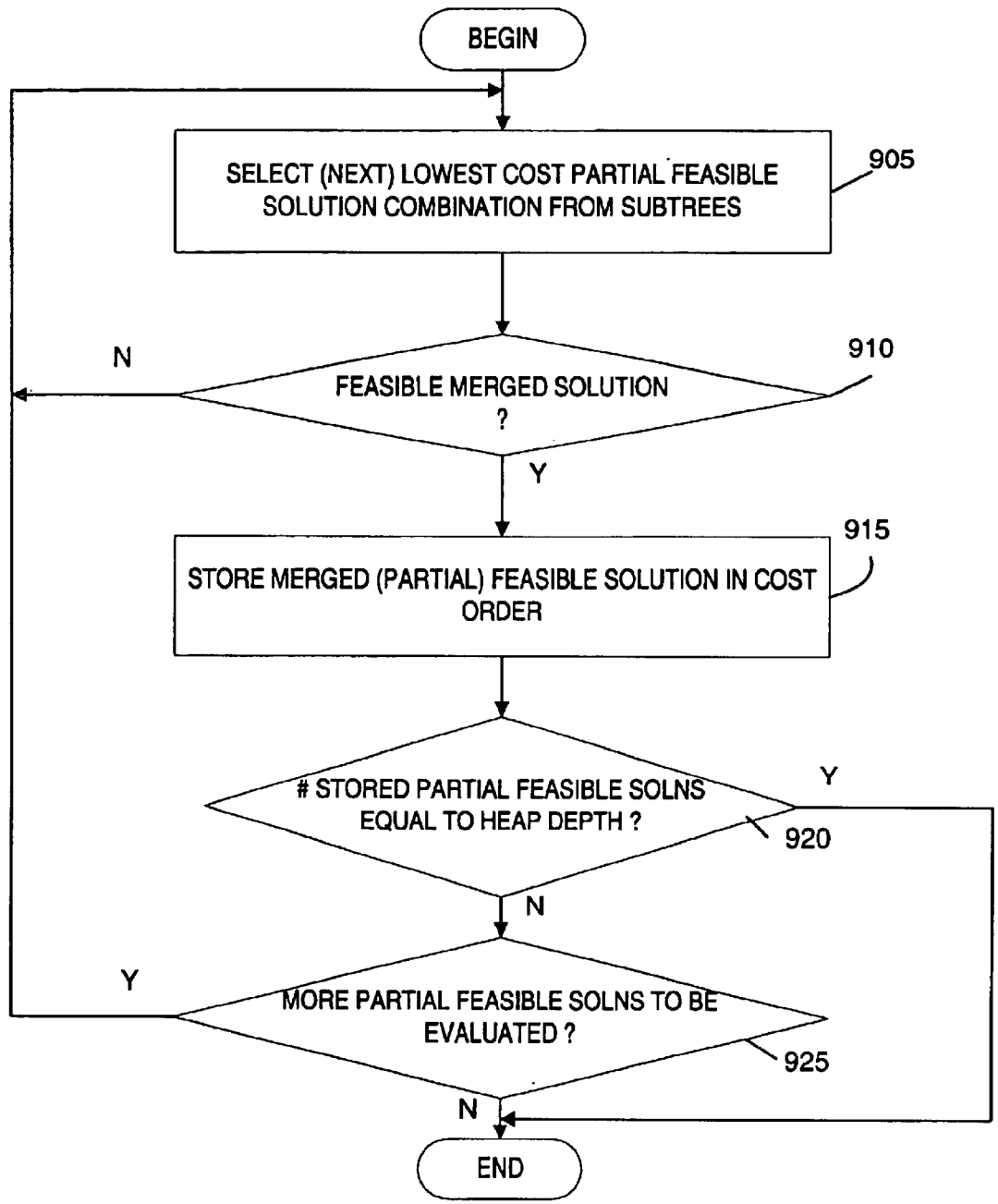
FIG. 9 is a flow diagram showing a method of one embodiment for merging partial feasible solutions.

For one embodiment, N is 2 such that two routing tree nodes or subtrees are merged at a time. Referring to FIG. 9, to merge two or more subtrees, at block 905, the lowest cost partial feasible solution from each of the subtrees (i.e. The first entry in the heap where the entries are ordered by cost function) is selected. It is then determined at block 910 whether merging the lowest cost partial feasible solution from each of the subtrees yields a (partial) feasible merged solution.

This determination may be made, for example, by identifying any conflicts between the partial feasible solutions to be merged and/or by using the method of FIG. 8 described above to identify feasible routing solutions to route wires between two partial feasible solutions to be merged. Conflicts may be identified by comparing X, Y coordinates, wire widths and design rule spacings for two wires to see whether they overlap, plow through another wire and/or are separated from another wire by less than design rule spacings. For some embodiments, the user may specify the number of feasible solutions to be identified when merging partial feasible solutions. For the example of FIG. 7, for instance, when merging AB and CD, the user may indicate that only two partial feasible routing solutions for BC are to be identified. In this manner, the user can have some additional control over the overall runtime of the routing process.

If merging the lowest cost partial feasible solution from each of the subtrees does yield a (partial) feasible merged solution, then at block 915, the merged (partial) feasible solution is stored in the heap corresponding to the node at which subtrees are being merged. As described above, the identified merged (partial) feasible solutions are stored in the heap in cost order according to the user-identified cost function(s) for one embodiment. Once partial feasible solutions are merged for a multi-terminal net, for one embodiment, the merged partial feasible routing becomes a port such that subsequent wires in the net may be coupled to any location on the merged partial feasible solution.

At block 920, it is then determined whether the number of stored (partial) feasible solutions equals the selected heap depth corresponding to the node. If not, the method proceeds at block 925 where it is determined whether any partial feasible solution combinations remain to be evaluated. If so, then at block 905, the next cheapest partial feasible solution combination from the subtrees being merged is selected and the method proceeds as described above.

Referring back to block 910, if the lowest cost partial feasible solutions from each of the subtrees to be merged cannot be merged, then at block 905, a next cheapest partial feasible solution combination may be selected. At block 910, the selected combination is evaluated to determine whether it yields a merged (partial) feasible solution.

At block 920, if the selected heap depth has been reached, the method ends at block 930. Also, at block 925, if there are no more (partial) feasible solution combinations to be evaluated, the method ends at block 930.

Referring back to FIG. 6, at decision block 630, it is determined whether all partial feasible solutions have been merged (i.e. whether all wires have been routed). If not, the method continues at block 615 as described above. If so, then at block 635, the final routing for the set of wires to be routed is identified from the one or more feasible routing solutions indicated by the routing tree developed in the above manner.

For the example of FIG. 7, the routing subtree for AB is merged with the routing subtree for CD in the above-described manner to identify the merged feasible routing solutions partially indicated in the diagram and in the table 730. The table 730 indicates how the feasible routing solutions for ABCD may be stored in a heap corresponding to the node ABCD when sorted by wire length and source to sink delay with a specified heap depth of four. A cost graph or other cost indicator showing the cost of the routing versus the user-specified cost function(s) may be easily extracted from the routing tree developed in the above manner.

For one embodiment, if, after developing a routing tree in accordance with the above-described approach, a designer decides to prioritize a different cost function, it is straightforward to apply the new cost function. When the new cost function is applied, because partial feasible routings have been stored at each node in the routing tree, the heaps corresponding to each node can just be re-ordered according to the new cost function to identify a lowest cost routing solution. In this manner, the routing tree does not have to be developed (i.e. new sets of partial feasible routings do not need to be identified) for the new cost function.

Further, if at any level of merging, the merging fails because there is not a feasible merged solution due to limited heap depth at the nodes being merged, it is relatively straightforward to go back down in the routing tree data structure to a lower-level node to identify more feasible solutions to be stored in the heap. Merging then proceeds again as described above to arrive at a final routing solution.

Using the above-described approach, a routing solution for a set of wires to be routed may be identified efficiently and according to one or more user-specified cost functions. Rip-up-rerouting (which may effectively be similar to an exhaustive search) is not necessary if a particular routing combination is determined not to be feasible, and thus, this approach may provide significant time savings for the routing process.

The final routing solution may be optimized on a more global basis than a routing solution determined using a conventional sequential router because global cost information is available regarding the feasible routing solutions before a final routing is selected. The final routing is not fixed at any point until one of the overall routing solutions identified using the routing tree data structure is selected.

The above approach may be applied to an entire integrated circuit device floorplan or i may be selectively applied to given areas of the floorplan that are more congested, for example, and, thus, may benefit more from a globally optimized routing solution. Further, for some embodiments, an integrated circuit device floorplan may be broken up into various regions that are each routed separately in the above-described manner.

For various embodiments, the user can control memory usage and runtime by specifying the number of solutions to be identified at any given node and/or the heap depth corresponding to the node. In this manner, the user can balance the level of routing optimization versus system resources and final routing time.

Figure 10:
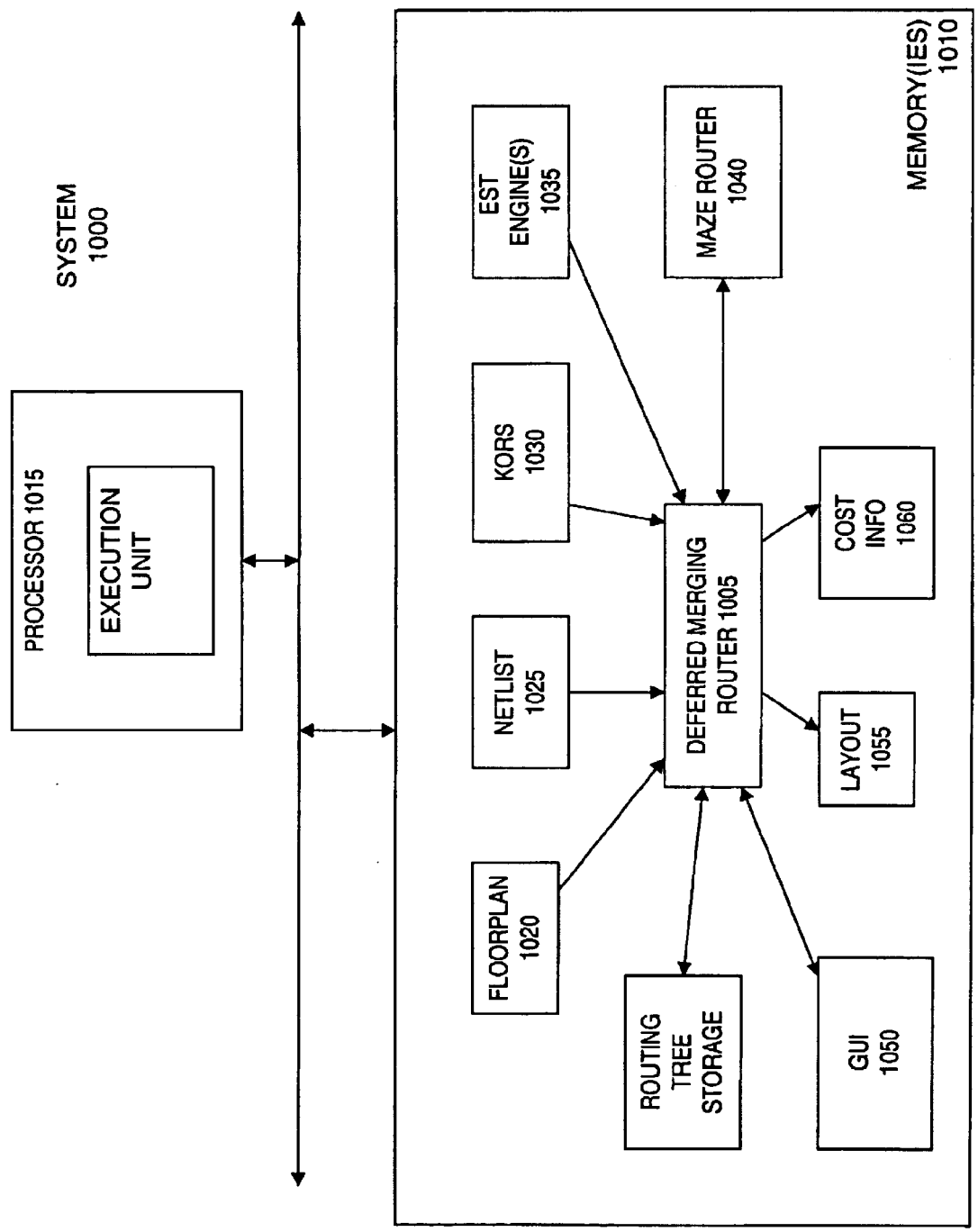
FIG. 10 is a simplified block diagram of a computer system that may be used to implement the method of one embodiment.

For one embodiment, as mentioned above, the method of FIG. 4 and/or FIG. 6 may be implemented in software 1005 as shown in FIG. 10 that is stored in one or more memories 1010 on a computer system 1000 and that includes instructions that are executed by a processor 1015. The memory (ies) 1010 may be any type of memory such as a mass storage device, a network storage device, random access memory, etc., that is accessible by the computer system either directly or indirectly. The computer system may be a workstation, for example, with a UNIX or LINUX operating system. Other types of computer systems using other types of operating systems may be used for other embodiments.

Also stored in the memory(ies) 1010 may be the input information including the floorplan 1020, a netlist 1025 including port/pin information, keep out region information 1030, and one or more estimation engines 1035 that may be used to identify the cost(s) associated with particular routing solutions. For one embodiment, one estimation engine is provided corresponding to each cost function. A timing estimation engine may be used to determine source to sink delays, for example, while a power estimation engine may be used to estimate power dissipation. Other types of engines evaluate feasible routes against other types of cost functions.

A maze router 1040, which may be used to determine partial feasible routing solutions, may also be stored in the memory 1010 for one embodiment. Storage 1045 for the routing tree data structure may be included along with a user interface 1050 through which a designer may specify the user-controlled features such as heap depth, number of solutions and cost functions to be used.

Output information provided as a layout 1055 including the final routing and, for some embodiments, a cost graph or other cost information 1060, may also be stored in the memory(ies) 1010 or another memory that may be coupled to the computer system 1000.

In the foregoing specification, the invention has been described with reference to specific exemplary embodiments thereof. It will, however, be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method comprising:
identifying partial feasible routing solutions corresponding to each of a subset of a set of wires to be routed, each of the partial feasible routing solutions identifying a feasible route between fixed points in a layout, at least two partial feasible routing solutions being identified for at least one of the wires to be routed;
constructing a routing tree from the identified partial feasible routing solutions for each of the subset of wires to be routed; and
following identification of the partial feasible routing solutions, merging the partial feasible routing trees to identify one or more feasible routing solutions for the set of wires to be routed, wherein merging includes selecting between the identified partial feasible routing solutions for each of the subset of wires to identify a partial feasible routing solution that does not conflict with a selected partial feasible routing solution for any of the other wires of the subset of wires.

2. The method of claim 1 further comprising:
selecting a routing solution from the feasible routing solutions.

3. The method of claim 1 further comprising:
sorting the identified partial feasible routing solutions and feasible routing solutions by a first user-selected cost function.

4. The method of claim 3 further comprising:
re-sorting the identified partial feasible routing solutions and feasible routing solutions by a second, different user-selected cost function.

5. The method of claim 1 further comprising:
limiting the number of partial feasible routing solutions identified to a first number; and
limiting the number of feasible routing solutions to a second number.

6. The method of claim 5 wherein merging comprises:
merging partial feasible solutions in a routing tree, wherein, if an associated limitation is specified by a user, the number of partial feasible routing solutions at each node of the routing tree is limited according to the user-specified limitation.

7. The method of claim 5 wherein identifying partial feasible routing solutions comprises:
generating Hanan's graph;
identifying a first partial feasible routing solution;
adding an obstacle to the first partial feasible routing solution; and
identifying a second, different partial feasible routing solution.

8. The method of claim 7 wherein adding an obstacle and identifying a different partial feasible routing solution are repeated until there are no more partial feasible routing solutions or until a user-specified limitation on the number of partial feasible routing solutions has been reached, whichever occurs first.

9. A method comprising:
constructing multiple partial feasible routing trees, each of the partial feasible routing trees identifying a set of partial feasible routing solutions for a subset of a set of wires to be routed, each of the partial feasible routing solutions identifying feasible mutes between fixed points in a layout; and
merging the multiple partial feasible routing trees to identify a set of feasible routing solutions for the set of wires to be routed.

10. The method of claim 9 wherein constructing multiple partial feasible routing trees comprises:
determining partial feasible routing solutions for each of the subset of wires to be routed until all partial feasible routing solutions have been identified or until a user-specified limit on the number of partial feasible routing solutions has been reached, whichever occurs first.

11. The method of claim 10 wherein determining partial feasible routing solutions comprises:
generating Hanan's graph;
identifying a first partial feasible routing solution;
adding an obstacle to the first partial feasible routing solution; and
identifying a second, different partial feasible routing solution.

12. The method of claim 10 further comprising:
determining a cost of each partial feasible routing solution according to a first user-specified cost function; and
ordering the partial feasible routing solutions by the cost.

13. The method of claim 12 wherein merging comprises:
merging the partial feasible routing solutions in increasing order of cost such that the feasible routing solutions are also ordered by cost.

14. The method of claim 13 further comprising:
re-ordering the partial feasible routing solutions and feasible routing solutions according to a second user-specified cost function.

15. A method comprising:
determining a first set of possible routes between a first set of fixed points in an integrated circuit layout, the first set of possible router being organized in a first routing tree;
determining a second set of possible mutes between a second set of fixed points in the integrated circuit layout, the second set of possible routes being organized in a second routing tree; and
merging the first and second routing trees to determine a third set of possible routes, the third set of possible routes including possible routes from the first and second sets of possible routes that do not conflict.

16. The method of claim 15 further comprising:
ordering the first and second sets of possible routes by cost according to a first user-specified cost function.

17. The method of claim 16 further comprising:
limiting the number of possible routes in the first, second and third sets according to one or more user-specified limitations.

18. The method of claim 15 wherein the first, second and third sets are organized as a routing tree, a root of the routing tree to include one or more possible routes for all wires to be routed.

19. The method of claim 16 further comprising: reordering the possible routes by cost according to a second user-specified cost function.

20. An apparatus comprising:
an integrated circuit device having wires routed according to a method comprising:
identifying partial feasible routing solutions corresponding to each of a subset of a set of wires to be routed, each of the partial feasible routing solutions identifying a feasible route between two nodes fixed in layout, at least two partial feasible routing solutions being identified for at least one of the wires to be routed;

organizing the identified partial feasible routing solutions for each of the subset of wires into a respective routing tree;

merging the routing trees to identify one or more feasible routing solutions for the set of wires to be routed, wherein merging includes selecting between the identified partial feasible routing solutions for each of the subset of wires to identify a partial feasible routing solution that does not conflict with a selected partial feasible routing solution for any of the other wires of the subset of wires; and selecting the routing from the one or more feasible routing solutions.

21. The apparatus of claim 20 wherein the method further comprises:

ordering the partial feasible routing solutions by cost according to one or more user-specified cost functions.

22. A data storage medium storing instructions to be executed by a computer system, the instructions comprising:

a maze router to determine partial feasible routing solutions for each of a subset of a set of wires to be routed, each of the partial feasible routing solutions to identify a feasible route between fixed points in a layout, the maze router to identify at least two partial feasible routing solutions for at least one of the wires;

instructions to organize the partial feasible routing solutions for each of the subset of wires into a respective routing tree; and a deferred merging router to merge the partial feasible routing solutions to generate one or more feasible routing solutions, wherein merging includes selecting between the identified partial feasible routing solutions for each of the subset of wires to identify a partial feasible routing solution that does not conflict with a selected partial feasible routing solution for any of the other wires of the subset of wires.

23. The data storage medium of claim 22 further storing instructions comprising:

a first estimation engine to determine a first cost of each partial feasible routing solution and each feasible routing solution according to a first user-specified cost function, the deferred merging router responsive to the first estimation engine to order the partial feasible routing solutions and the feasible routing solutions by the first cost.

24. The data storage medium of claim 22 wherein the maze router is responsive to a user-specified limitation to limit the number of partial feasible routing solutions and feasible routing solutions determined for any of the subset of wires to be routed.

25. The data storage medium of claim 24 wherein the deferred merging router organizes the partial feasible routing solutions in a routing tree to identify the feasible routing solutions.

26. The data storage medium of claim 23 wherein the deferred merging router is responsive to a second estimation engine to re-order the partial feasible routing solutions and the one or more routing solutions according to a second user-specified cost function.

27. A data storage medium storing instructions which, when executed by a computer system, cause the computer system to perform a method comprising:

identifying partial feasible routing solutions corresponding to each of a subset of a set of wires to be routed, each of the partial feasible routing solutions identifying a feasible route between points fixed in a layout, at least two partial feasible routing solutions being identified for at least one of the wires to be routed;

organizing the identified partial feasible routing solutions for each of the subset of wires into a respective routing tree; and merging the partial feasible routing solution routing trees to identify one or more feasible routing solutions for the set of wires to be routed, wherein merging includes selecting between the identified partial feasible routing solutions for each of the subset of wires to identify a partial feasible routing solution that does not conflict with a selected partial feasible routing solution for any of the other wires of the subset of wires.

28. The data storage medium of claim 27 further storing instructions which, when executed by a computer system cause the computer system to perform a method further comprising:

sorting the identified partial feasible routing solutions and feasible routing solutions by a first user-selected cost function.

29. The data storage medium of claim 28 further storing instructions which, when executed by a computer system cause the computer system to perform a method further comprising:

re-sorting the identified partial feasible routing solutions and feasible routing solutions by a second, different user-selected cost function.

30. The data storage medium of claim 27 further storing instructions which, when executed by a computer system cause the computer system to perform a method further comprising:

limiting the number of partial feasible routing solutions identified to a first number; and limiting the number of feasible routing solutions to a second number.

* * * * *

UNITED STATES PATENT AND TRADEMARK OFFICE
CERTIFICATE OF CORRECTION

PATENT NO. : 6,766,502 B1
DATED : July 20, 2004
INVENTOR(S) : Pyo et al.

It is certified that error appears in the above-identified patent and that said Letters Patent is hereby corrected as shown below:

Column 3,
Line 37, delete "muting" and insert -- routing --.
Line 47, delete "mute" and insert -- route --.

Column 5,
Line 18, delete "doffed" and insert -- dotted --.

Column 8,
Line 13, delete "i" and insert -- it --.

Column 9,
Line 10, delete "rounting" and insert -- routing --.
Line 66, delete "mutes" and insert -- routes --.

Column 10,
Line 38, delete "mutes" and insert -- routes --.

Signed and Sealed this

Sixteenth Day of November, 2004

JON W. DUDAS
*Director of the United States Patent and Trademark Office*